United States Patent

Gorbet et al.

[11] Patent Number: 5,941,714
[45] Date of Patent: Aug. 24, 1999

[54] DIGITAL COMMUNICATION, PROGRAMMABLE FUNCTIONING AND DATA TRANSFER USING MODULAR, HINGED PROCESSOR ELEMENTS

[75] Inventors: Matthew Gorbet, Boston; Margaret Orth, Cambridge, both of Mass.

[73] Assignee: Massachusetts Institute of Technology, Cambridge, Mass.

[21] Appl. No.: 08/935,587

[22] Filed: Sep. 23, 1997

[51] Int. Cl.[6] .................................................. H01R 11/30
[52] U.S. Cl. .............................................. 439/38; 439/928
[58] Field of Search ...................................... 439/38, 44–7, 439/928, 950

[56] References Cited

U.S. PATENT DOCUMENTS

| | | | |
|---|---|---|---|
| 3,086,268 | 4/1963 | Chaffin, Jr. | 24/201 |
| 3,177,546 | 4/1965 | Bey | 24/201 |
| 3,299,390 | 1/1967 | Eckelkamp | 339/12 |
| 3,556,529 | 1/1971 | Noriega | 273/137 |
| 3,914,878 | 10/1975 | Lu | 35/19 A |
| 3,973,661 | 8/1976 | De Boo et al. | 197/1 R |
| 4,055,019 | 10/1977 | Harvey | 46/30 |
| 4,112,941 | 9/1978 | Larimore | 128/2.06 E |
| 4,195,515 | 4/1980 | Smoll | 73/194 |
| 4,544,903 | 10/1985 | Grant | 335/205 |
| 4,653,503 | 3/1987 | Heath | 128/640 |
| 5,272,381 | 12/1993 | Millard | 307/17 |
| 5,328,381 | 7/1994 | Seymour et al. | 439/247 |
| 5,339,133 | 8/1994 | Otomo et al. | 355/200 |
| 5,410,807 | 5/1995 | Bross et al. | 29/843 |
| 5,691,885 | 11/1997 | Ward et al. | 439/44 |

Primary Examiner—Steven L. Stephan
Assistant Examiner—Eugene G. Byrd
Attorney, Agent, or Firm—Cesari and McKenna, LLP

[57] ABSTRACT

Tiling processor elements facilitate manipulation of digital information and processing through user-defined relationship between the elements. Each element represents an independent computational entity with predefined properties and functionality, but the behavior of an arrangement of these elements depends on the arrangement itself-not just the characteristics of the individual devices. In this way, unique computational entities may be constructed based on, but not limited to, the capabilities of the individual devices. Rearrangement of the elements defines and alters the functionality of the resulting element network.

29 Claims, 5 Drawing Sheets

DIGITAL COMMUNICATION, PROGRAMMABLE FUNCTIONING AND DATA TRANSFER USING MODULAR, HINGED PROCESSOR ELEMENTS

FIELD OF THE INVENTION

The present invention relates to electronic interfaces and, more particularly, to modular processing entities that may be detachably connected into varying physical arrangements.

BACKGROUND OF THE INVENTION

Data communication in a computer network involves the exchange of data between two or more entities interconnected by communication links. Generally, the functions associated with the various communicating entities and the network itself are fixed; that is, entry of an entity into the network does not affect the functioning of the network, or of the entities themselves. While this model is well-suited to traditional processing environments where computational roles remain unchanged and the network is intended merely to facilitate resource sharing and communication, it limits the user relevance of computers to applications—such as word processing, spreadsheet, and database systems—involving the performance of routine tasks.

Indeed, the idea of a single individual operating a single station on a computer network by its very nature limits the uses to which computers may be put, as well as the relationship between computers and their users. The user's interaction with the computer is typically limited to information exchanged on a video screen. Even interfaces that allow the user to enter commands and data through action, rather than by keystroke, expand the degree of interaction only marginally. For example, interface devices such as the mouse and the joystick follow a "marionette" model, mimicking on-screen the gestures of a user. Interaction with the computer is therefore limited by the need for physical dexterity in manipulating the input device, as well as by the limited responses offered by the computer itself. Accordingly, while such interface devices may vary the mode of interaction, its scope remains essentially unchanged: output is confined to the screen, and input arises from highly constrained user gestural patterns.

To extend the capabilities of computers beyond the screen and into users' lives, proposals have been made for "augmented objects," such as coffee cups and stuffed animals that afford an entirely different approach to user-computer interaction. These devices, of course, have their own inherent limitations based on the modes in which the user would normally interact with the (unaugmented) object.

SUMMARY OF THE INVENTION

The present invention provides an approach to manipulating general digital information through the relationships and arrangement of a set of tiling processor elements. Each element represents an independent computational entity with predefined properties and functionality, but the behavior of an arrangement of these elements depends on the arrangement itself—not just the characteristics of the individual devices. In this way, a user can construct a unique computational entity ultimately based on the capabilities of the individual devices, but behaving in a manner determined by the user's arrangement.

Key to the invention is the ability to tile or tesselate the individual processor elements, creating operative electrical connections among adjacent elements as a consequence of their placement. This allows any element to establish communication with any other element in the arrangement, as well as to acquire information concerning the topology of the arrangement (ranging from the identities of neighboring elements to the relative placement and identity of every element).

Accordingly, in a first aspect, the invention comprises an electronic element configured for hinged, detachable connection to a plurality of other elements in an edge-to-edge relationship. The element comprises a polygonal, preferably planar body having a plurality of contact edges, preferably of identical lengths to facilitate even tesselation; the simplest shape fulfilling these criteria is an equilateral triangle, but different shapes may be used even within the same arrangement. In general, the overall functionality of the element and its communication with other elements are directed by a microprocessor residing on or within the body. Mechanical and electrical connection between elements is facilitated by connectors carried on each contact edge. Each connector includes at least one (and generally a plurality) of electrical contacts coupled to the processor, as well as mating means for detachably joining the connector to a connector on another polygonal element having a complementary mating means. Upon joinder of the edges of two elements, the mating means creates an electrical connection between the electrical contacts of the adjacent connectors, and also serves to retain the edges against one another. Preferably, the edges remain joined even if they are pivoted—that is, the connector acts as a hinge or joint. This allows the elements to be assembled into a three-dimensional structure. Furthermore, it is preferred that the connectors enforce mutual alignment so that bringing the edges together ensures connection between the electrical contacts.

In one approach, the mating means comprises one or more magnets disposed so as to attract magnets similarly disposed in the connector of another element; for example, the magnets may alternate in polarity so that only one orientation, which ensures alignment between opposing contacts, is possible. The magnets may also serve as electrical contacts. In another approach, the mating means comprises a conductive hook-and-pile material (e.g., VELCRO material), complementary strips of which are symmetrically disposed along each connector so that properly opposed connectors secure to one another. The hook-and-pile material, being conductive, also serves as the electrical contacts.

It is not necessary, of course, for the magnets or hook-and-pile material also to serve as contacts. The contacts can be as simple as foil traces on the exterior of a nonconductive connector body. Preferably, however, because connectors that do not attract one another must be drawn and held together by other means (e.g., by magnets distinct from the connectors themselves), materials that do not require substantial contact force for good mechanical connection are preferred. For example, soft materials such as conductive pile, conductive fabric, or conductive foam are less sensitive to the slight shifts in position or contact force that can occur as the elements are arranged.

The processor associated with an element executes functions associated with that element, or with all of the elements generally. Such functions may include, for example, emitting a particular type of user-perceivable output (such as a light or message, a sound, etc.) or accepting a user or environment input (e.g., via a sensor or transducer). Alternatively, the processors may be generic, with functionality imposed by an externally attachable module interfacing with the processor.

The processor is configured to detect the presence of an adjacent element, and to establish communication with its processor. Typically, the processors are associated with unique codes or identifiers, and are configured to exchange at least this identity information with neighboring processors. In a representative configuration, a host or master element supplies power and control signals to the other elements, and acquires, through message-passing among the elements, a picture of the network topology—that is, a map of the elements with respect to one another. Alternatively or in addition, the elements can be configured to establish a common communication line connecting all of the elements; for example, the communication line may define a local area network or "multicast" bus, such that data placed on the line by any processor reaches the processors of all other elements. Such a configuration obviously requires a mechanism for arbitrating communications, since the line is open at all times to all processors, and the necessary arbitration may be provided by the master element. This element may contain a highly sophisticated processor or, more typically, is connected to a host computer with conventional processing, memory and storage capabilities.

The invention represents a highly generalized architecture amenable to a variety of applications. In general terms, the elements can be used to assemble modular computational devices whose behaviors are topology-dependent; to provide a computer interface based on topography and relationships among computational objects; to represent or associate data with physical objects and structures; or to control and route streamed information (e.g., video or audio signals), either among the elements themselves or using the elements symbolically, e.g., to control an external system in accordance with the elements' arrangement. Representative applications based on this principle include modular, user-configurable computational devices; puzzle-like games of intercommunicating, tesselating elements that respond in accordance with the manner in which they are assembled (e.g., telling a nonlinear story, or interacting with a user in varying ways); electronic musical instruments formed by combinations of elements, and whose characteristics depend on the way in which the elements are arranged; representing intangible data elements to facilitate their manipulation (e.g., using the elements to represent key words (or concepts) and boolean operators for text-searching operations); or imparting electronic functionality to interconnecting design elements, thereby facilitating construction of three-dimensional objects whose electronic behaviors are in some way related to their physical structures.

BRIEF DESCRIPTION OF THE DRAWINGS

The invention description below refers to the accompanying drawings, of which.

DETAILED DESCRIPTION OF THE PREFERRED EMBODIMENTS a. The Processor Elements

Figure 1:
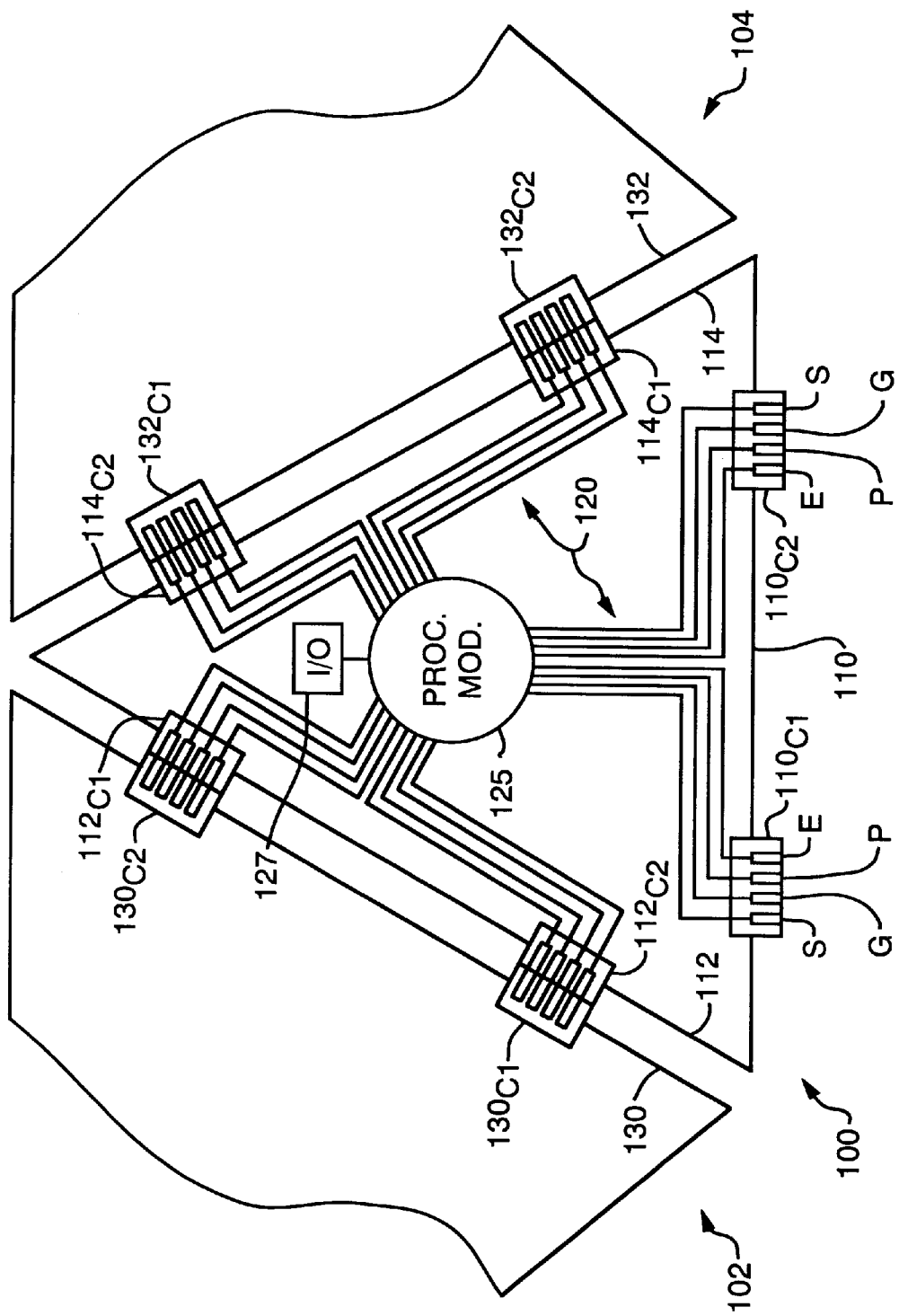
FIG. 1 is a partially schematic plan view of a series of hinged, polygonal processor elements in accordance with the invention, arranged in a planar configuration.

Refer first to FIG. 1, which illustrates a series of hinged, polygonal processor elements 100, 102, 104 in accordance with the invention, arranged for edge-to-edge contact. Each element is shaped as an equilateral triangle, and has a pair of connectors on each of its three edges. Thus, element 100 has three edges 110, 112, 114, each supporting respective pairs of connectors $110_{C1}$, $110_{C2}$; $112_{C1}$, $112_{C2}$; and $114_{C1}$, $114_{C2}$. Each connector has a series of electrical contacts associated therewith; for exemplary purposes, each connector is shown with four electrical contacts, indicated with respect to connectors $110_{C1}$, $110_{C2}$ by reference letters S, G, P, E (it being understood that the other connectors have similar series of contacts); the significance of these letter designations is explained below. Correspondingly identified contacts of different connectors generally have the same function associated with them. Typically, the element is planar in configuration, fabricated from a sturdy, nonconductive material such as plastic, and the contacts are connected to internal circuit components by conductive traces (representatively indicated at 120) on the surface of the element. At a minimum, the internal circuitry comprises an electronic component 125, the features of which are described in greater detail below. Generally component 125 is a processor module, but may also be another functional component (e.g., an ID chip).

The element 100 may also include an input/output (I/O) device 127, which receives input from a user and/or provides a user-perceivable output. For example, device 127 may be a piezoelectric touch sensor, which senses the press of a user's finger; or an output device such as a light-emitting diode (LED) or speaker. I/O device 127 is connected to processor module 125, supplying input thereto and/or issuing an output in response to signals from module 125.

In the illustrated embodiment, each of the other elements 102, 104 is identical to element 100, and each edge of each element contains an identical number of identical connectors, displaced from one another along the edge by an equal distance. As a result, when any edge of a first element is brought into opposed alignment with the edge of any second element, the contacts of each connector of the first element align with the contacts on the connectors of the second element. The connectors also mechanically mate, bringing the contacts of the opposed elements together so that electrical current flows across the mated contacts, and retaining this connection despite pivoting of the opposed edges with respect to each other. Accordingly, when edge 112 of element 100 is brought into alignment with edge 130 of element 102, connector $112_{C2}$ mates with connector $130_{C1}$, and connector $112_{C1}$ mates with connector $130_{C2}$. Similarly, when edge 114 of element 100 is brought into alignment with edge 132 of element 104, connector $114_{C2}$ mates with connector $132_{C1}$, and connector $114_{C1}$ mates with connector $132_{C2}$. Because the opposed connectors are necessarily complementary (that is, a "C2" connector always mates with a "C1" connector, and vice versa), the order of the contacts is reversed on the connectors of each edge. In the illustrated implementation, contact S is a serial line (whose role is described hereinafter); contact G is ground; contact P is power; and contact E facilitates data exchange between immediately neighboring elements, serving an input port on one connector of an edge and an output port on the other connector.

It should be emphasized that, although identically shaped elements are illustrated, this is not necessary; all that is required, in fact, is for the contacts to be identically spaced along contact edges. It is preferred for all edges of the different elements to have the same length in order to facilitate complete tesselation, but once again, this is not strictly necessary. Elements may, but need not be, radially symmetric.

Figure 2:
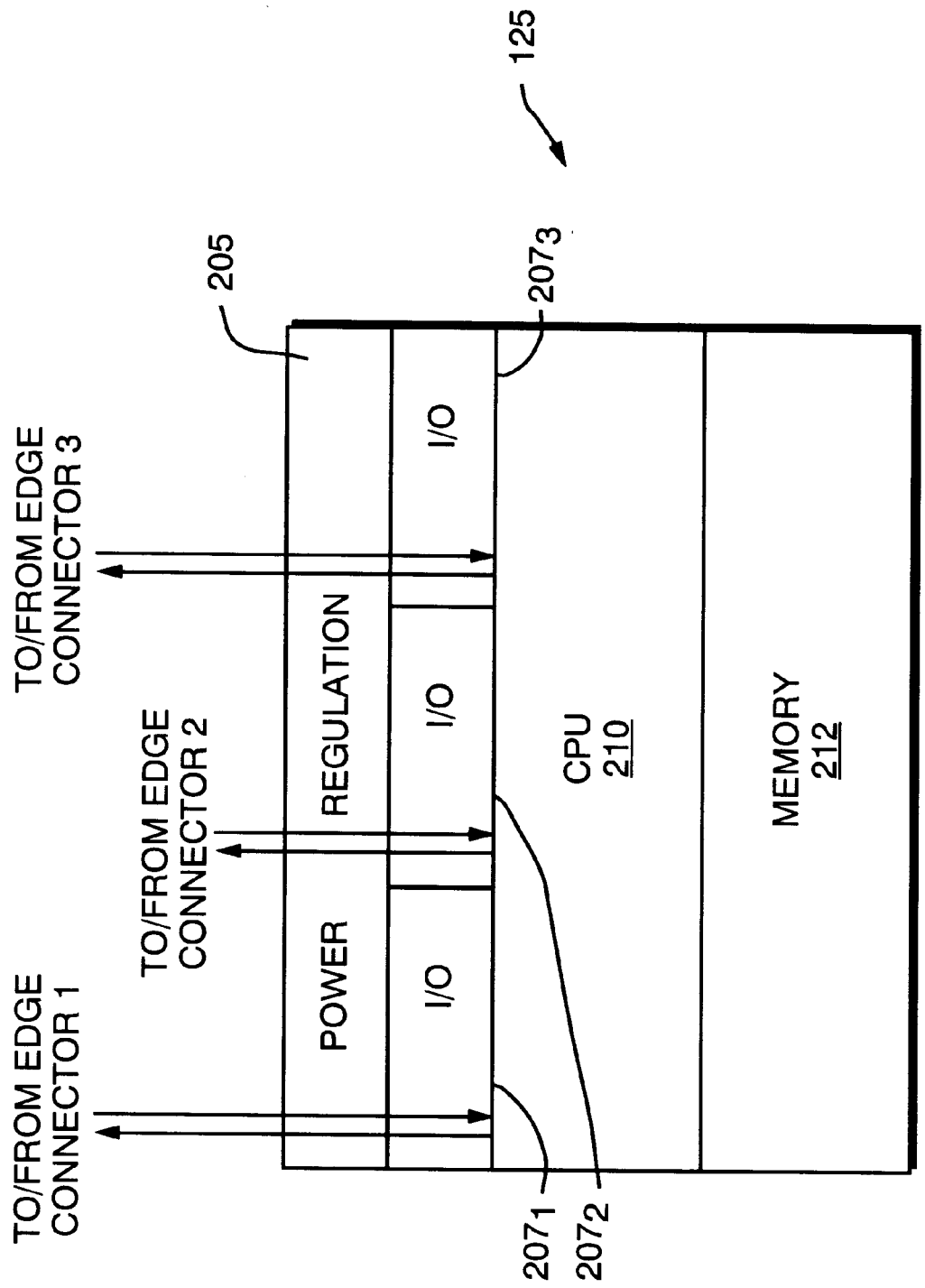
FIG. 2 schematically illustrates the primary components of the processor module of the elements shown in FIG. 1.

A representative processor module 125 is shown in FIG. 2. It includes a power-regulation circuit 205, through which the power supply and communication signals from each edge connector pass before reaching other internal circuitry. In order to ensure proper signal and power transmission across mated contacts whose mechanical connection is less than ideal, it may be desirable to apply to the power contacts a higher voltage level than is necessary to drive the processor circuitry; for example, it may be found useful to drive 12V across the P contacts while applying the standard TTL level of 5V to the processor circuitry. Accordingly, power-regulation circuits 205 contain conventional electronic components (or their discrete equivalents) effecting DC voltage reduction for incoming power. Because a single element can receive power over more than one edge from multiple neighboring elements, regulation block 205 maintains an even voltage regardless of the number of active power connections. At the same time, the power terminals of an unoccupied edge can also supply power to newly added neighboring elements. Suitable circuitry to accomplish these functions is well-known in the art, and may include rectification and filter components, as well as a voltage regulator.

Signals transiting over the other (E, G and S) contacts preferably remain at standard TTL voltage levels, since imperfect mechanical connection between contacts generally will not prohibit discrimination between binary states. If the power contacts are driven at higher voltage levels, however, it is preferred to connect pull-up or pull-down resistors to protect the E, G and S lines against accidental exposure to these higher voltages.

Alternatively, power contact P can be eliminated for some or all elements in an arrangement through the use of an on-board power supply—e.g., a battery, solar cell, or other source of electrical power.

A series of I/O circuits $207_1$, $207_2$, $207_3$, one dedicated to each edge connector, effect signal transfer across the communication channel represented by the E contact and, if it is included, across the channel represented by the S contact; because these communication channels are different in purpose and function, the associated I/O circuitry will differ, but in both cases is conventional.

Power from circuits 205 and signals from circuits 207 are applied to a programmable microprocessor or CPU 210, which effectuates the functions associated with the element. CPU 210 includes suitable arithmetic and logic capabilities for processing instructions and routing signals, and may be, for example, one of the microprocessors supplied by Microchip Technology Inc., Chandler, Ariz. CPU 210 communicates with a computer memory 212, which contains instructions representing the functionality of the element. Memory 212 may comprise fixed-storage (e.g., read-only memory (ROM), Flash ROM or programmable ROM, etc.) and volatile (generally random-access memory (RAM)) components. In particular, a program stored in permanent memory causes execution of a recognition and information-exchange sequence when CPU 210 first receives power; in this way, the newly connected element announces itself to the already-existing element network by trading information with its immediate neighbor. This is discussed in greater detail below.

The connectors can take a variety of forms, so long as they are able to satisfactorily mate with a complementary connector. In one approach, the connectors include magnets arranged so as to attract magnets disposed in a complementary fashion on the connectors of an adjacent element. One version of this approach, shown in FIG. 3, utilizes the magnets themselves as electrical contacts. The connector 300 includes a series of electrically conductive disk magnets 305. In one arrangement, magnets 305 have alternating exterior poles; in the other connector of the same edge (not shown), the magnets would be identical in number and edge positioning, but reversed in their order of polarity.

Figure 3B:
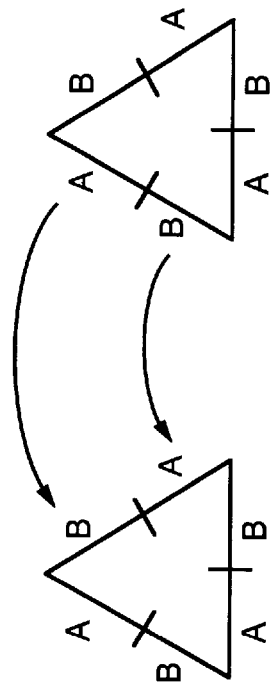
FIG. 3B schematically represents the manner in which magnets may be arranged in a symmetrical fashion to facilitate edge connection among elements.
Figure 3A:
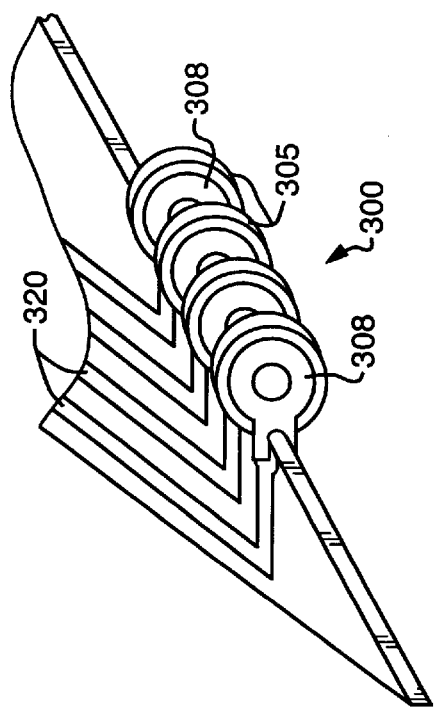
FIG. 3A is an isometric view of an edge connector in accordance with the invention, and which uses a series of magnets that also serve as electrical contacts.

More generally, however, various arrangements of magnet polarity may be used so long as the arrangement is symmetrical about the midpoint of each side, so that any side of one element can mate with any side of another element. This is illustrated in FIG. 3B. Each side of both elements contains two arrangements A and B of magnets per side. The magnets of each arrangement are complementary in polarity to the magnets of the other arrangement, so that any two sides will mate as illustrated. Thus, magnets alternating in polarity and distributed symmetrically on each side of the midpoint (as noted above) fulfill this condition. But non-alternating arrangements are also possible. For example, an eight-magnet arrangement (representing two connectors) can have the polarity sequence NNNN SSSS, each set of four magnets representing a connector and being disposed equidistantly from the midpoint.

Unequal magnet spacing may also be used to enforce proper alignment between opposed connectors by creating repulsion except when opposed sides are aligned. Once again, the unequal spacing is symmetrical about the midpoint of each edge. Preferably there are an even number of magnets 305. Each of the magnets 305 is held firmly (but not fixedly) between a pair of metal lugs representatively indicated at 308. Each pair of lugs 308 is soldered to a conductive foil trace 320, which leads to processing module 125 (see FIG. 1). In this way, electrical contact is established between the processing module and the magnets, which serve as the contacts S, G, P, E.

To ensure proper contact between the opposed magnets of neighboring edges, the magnets 300 should not be held fixedly between lugs 308, which would prevent magnets slightly recessed relative to others on the same connector from making contact with complementary magnets on a mating connector. Some degree of permitted movement allows the magnets to establish contact by virtue of their magnetic attraction for their polar opposites. To limit excessive play, magnets 300 may be provided with center holes and retained on axles spanning lug pairs, the axles having diameters smaller than those of the magnets' center holes (the difference in diameters defining the degree of permitted movement).

Figure 4:
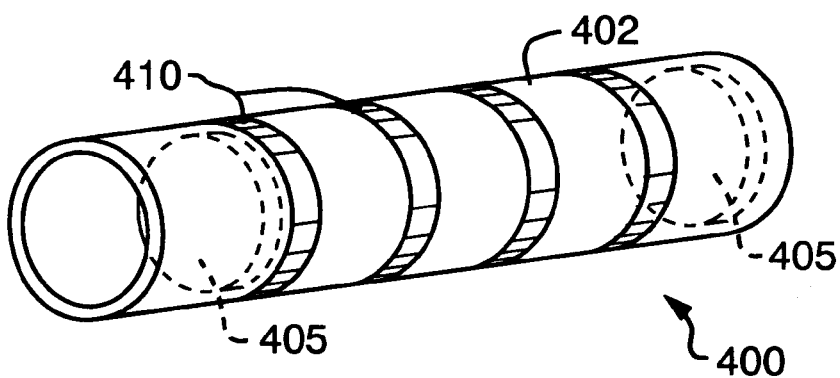
FIG. 4 is an isometric view of an edge connector that uses a series of insulated magnets, with the electrical contacts on the exterior of the insulating element.

In another version of this approach, shown in FIG. 4, the magnets are recessed within a tube. In particular, the connector 400 comprises a magnetically and electrically nonconductive (e.g., plastic) tube 402 containing, within its interior, at least one but preferably two or more magnets 405 of opposite exterior polarity. These magnets are equally or, again, symmetrically spaced about the midpoint, and the order of polarity is reversed within the two connectors of a single edge, so that the magnets 405 attract their complements in the connectors of an opposed, identical element edge. This version permits the use of odd numbers of magnets, so long as one of the magnets is disposed at the midpoint. (In the simplest case, each connector 400 of an edge contains a single magnet 405 of opposite exterior polarity.)

Disposed around the exterior surface of tube 405 are a series of electrical contacts 410. These may be metal foil traces or other electrically conductive material, such as conductive fabric, condutive pile material, conductive hook-and-pile material (e.g., VELCRO material), or conductive foam; a soft or hairy conductive material is particularly preferred for the degree of contact afforded. The number of magnets 405 and their strengths are selected to ensure electrical connection between the contacts 410 of opposed connectors. Two or more magnets 405 are preferred not only to enhance attraction between opposed connectors, but also to enforce proper alignment therebetween. Again, where a plurality of magnets is employed for each connector, they are either equally spaced or have mirror-symmetrical spacing with respect to the other edge connector.

Figure 5:
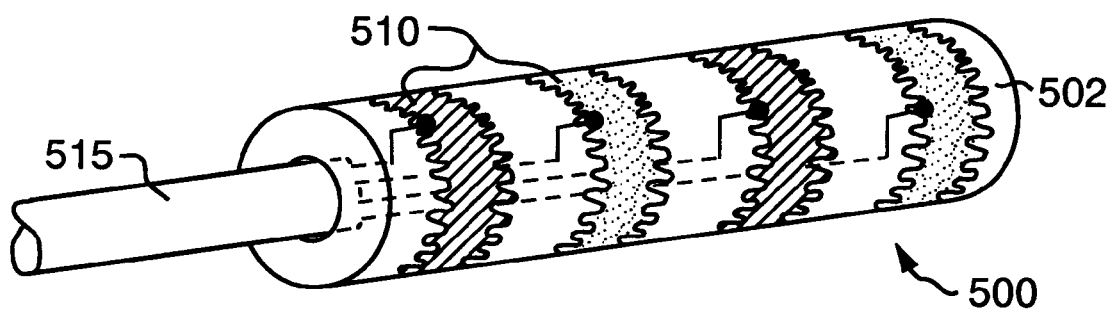
FIG. 5 is an isometric view of an edge connector that uses conductive hook-and-pile material for hinging and electrical connection.

In another approach, illustrated in FIG. 5, a conductive hook-and-pile material furnishes both mechanical connection and electrical contact between opposed connectors. In particular, the connector 500 comprises a nonconductive tube 502 having wrapped, therearound, a series of strips 510 of the conductive hook-and-pile material, the strips alternating in complementarity; that is, the first strip may be the hook material, the second strip the pile material, and so on. A cable 515, originating with the processor module, is received in the end of tube 502. Cable 515 contains wires separately brought out to the exterior surface of tube 502, each connected to one of the strips 510. Once again, strips 510 are either equally spaced or have mirror-symmetrical spacing with respect to the other edge connector.

b. Arrangements of Elements and Network Communications

Arrangement of the polygonal elements of the present invention can, depending on the application, result in various behaviors on a systemwide or element-by-element basis, as well as effect data-transfer among elements. Most broadly, the nature and extent of these capabilities depend on processor capacity, programming and overall network design; more narrowly, however, the ability of the elements to perform tasks in accordance with the invention ultimately depends on their capacity to communicate with an immediate neighbor. Generally, elements in accordance with the invention are given unique processor identifiers, and are configured to exchange at least this identifying information. For example, with renewed reference to FIG. 1, contact E of the "C1" connectors (hereafter denoted as $E_{C1}$) can be configured as an input port, while contact E of the "C2" connectors (hereafter denoted as $E_{C2}$) can serve as an output port; accordingly, each of a mated pair of elements will always have its input port $E_{C1}$, connected to the output port $E_{C2}$ of the other element, and vice versa. When a new element is added to an array, it receives power, and is programmed to issue in response an identification message over its $E_{C2}$ ports; the message is received by all neighboring elements through their $E_{C1}$ ports, and causes these neighboring elements to issue their own identification message (over their $E_{C2}$ ports) in response. Each of the elements saves the received message in memory 212, and may transmit the message further as described below. Moreover, each element may be programmed such that receipt of an identifier message prompts some action (e.g., a processor task involving I/O module 127), or such that the nature of the action depends on the particular identifier received; in other words, the element may have a particular processor task uniquely associated with it, or may instead select from a repertoire of actions (or no action) depending on the message it receives. As a result, each arrangement can be unique in terms of the behavior of the system and/or its constituent parts. For example, if every side of a triangular element is unique, every possible connection of two sides is unique, and a system of only four elements is capable of creating over 1620 possible flat configurations (since $x \geq 3^n(n+1)!/6$, where n=number of triangles and x=number of possible configurations), as well as 54 different pyramids. If each element (as opposed to each edge of each element) is associated with a single symbolic meaning, however, the number of possible configurations drops to 38.

Figure 6:
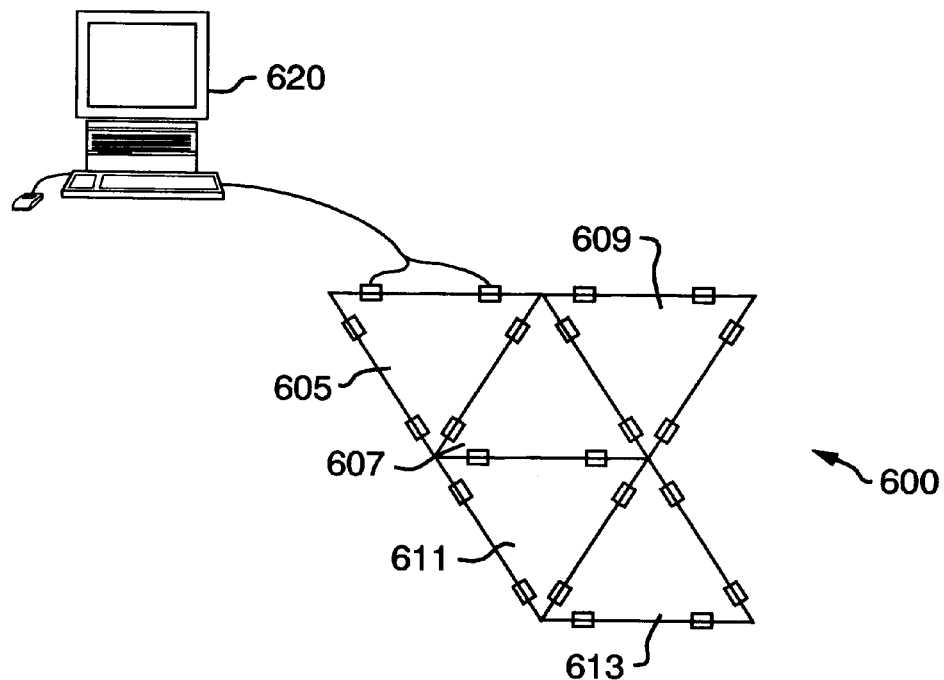
FIG. 6 schematically illustrates a representative topology of processor elements.

Thus, while the basic identification scheme allows each element to learn the identity of its nearest neighbors, it does itself does not afford a systemwide representation of the elements' topology so that any selected combination of elements has meaning. One approach to developing a network structure with systemwide "awareness" is shown in FIG. 6. An arrangement 600 of triangular processor elements as discussed above includes a "master" triangle 605 and a series of subordinate triangular elements 607, 609, 611, 613 connected to one another as shown. Master element 605 is connected to a conventional workstation or general-purpose computer 620 acting as a host, receiving data from and sending data to master element 605. Master element 605 (and hence the rest of the system 600) can be independently powered, or can instead receive power from computer 620. Alternatively, master element 605 can have the computational capacity of computer 620 built into its processor module, along with ports accepting connection of a traditional display and a traditional input device (such as a keyboard) for interaction with a system user.

In accordance with the foregoing approach, each subordinate element is defined not only by its identifier, but also by a route length, which is generally the number of elements intervening bewteen the subordinate element and master element 605; for convenience, this distance is termed a "height." Thus, element 607 is immediately adjacent to master element 605, and so has a height of one; elements 607 and 609 have a height of two; and element 613 has a height of three.

These heights are established and utilized as follows. As an element is added to the array, its neighbor transmits to it (over its output port $E_{C2}$ connected to the new element's input port $E_{C1}$) the neighbor's identifier and its height; the newly added element recognizes its own height as one greater than the received height, stores both its own height level and the height level received from the neighbor (as well as the neighbor's identifier and a number signifying the edge to which the neighbor is connected), and transmits to that neighbor its own (just-calculated) height and its identifier. The new element, like its neighbor, is programmed to undertake this same exchange of information with still newer elements as these are connected to its free edges, and to receive and store height, edge and identifier information from such elements. (More generally, when a new element is added, it polls all of its edges to determine whether it has made initial contact with a plurality of neighboring elements, and if so, repeats the above sequence for all of these. The result is a plurality of messages regarding the new element that propagate to the host as described below, the host reconciling them as part of the same connection event—that is, a single system event.)

Each element of the array, then, "knows" its own height and the height and identifier of each adjacently neighboring element. When an element receives height and identifier information from a neighbor, it is programmed to transmit this to the neighboring element having the lowest height level. In this way, the information propagates to master element 605 and computer 620, which utilizes it to build a representation (stored in its own internal memory) of the topology of elements—that is, a list of identifiers, their associated heights, and the edge-to-edge connections among elements. Heights are assigned by adding one to the height of the neighboring element with the lowest height upon connection thereto. If an element has two neighbors of equal height, the element to which messages are passed does not matter, since this does not affect ultimate delivery of the message to master element 605.

One approach to exchange of information between neighboring elements may be represented at the signal level as follows. Each element communicates with neighboring elements by sequentially polling its edges. Each element polls for a unique amount of time based on its identifier. Thus, for a first element to exchange information with a second element, the first element pulls its output port $E_{C2}$ low to poll for its unique amount of time. If the second element pulls its output port $E_{C2}$ low during this time, the elements can exchange information. The element to first raise its output port at the end of its polling time (for example, the first element) becomes the first sender. The other (second) element responds by acknowledging receipt and sending its identifier and height. Assume the first element has a message to send. If the second element is the lowest-height neighbor of the first element and does not have a full message stack, the first element sends its message to the second element. The first and second elements acknowledge, and the second element then passes the message, repeating the above sequence for its own lowest-height neighbor.

Because the topology of the network can change as elements are added and removed, the elements are preferably capable of self-reorganization. Elements are programmed to recognize removal of a neighboring element through the loss of contact, and to send to the lowest-height remaining neighbor a message containing the identifier of the removed element, the edge with which it formerly had contact, and a code specifying loss of contact; this message propagates to computer 620, which updates its network topology accordingly. If an element has a message to send and cannot locate a neighbor with a height lower than its own height, the element is programmed to raise its own height to be one greater than its lowest-height neighbor, thus ensuring a "downhill" message path. In this way, messages do not get trapped in dead ends, and always propagate to the host.

These communication capabilities, while rudimentary, are sufficient to facilitate a substantial variety of capabilities. Each element, for example, may have a specific processor function or task associated with it (e.g., receiving an input stimulus or issuing an output), while the pattern and manner in which each processor performs its task is dictated by the overall system topology (based on the representation stored in computer 620, and in accordance with a master control program stored in computer 620). Indeed, much of the system processing capacity can be lodged in computer 620, with the network arrangement primarily dictating operation of a stored system program.

Figure 7:
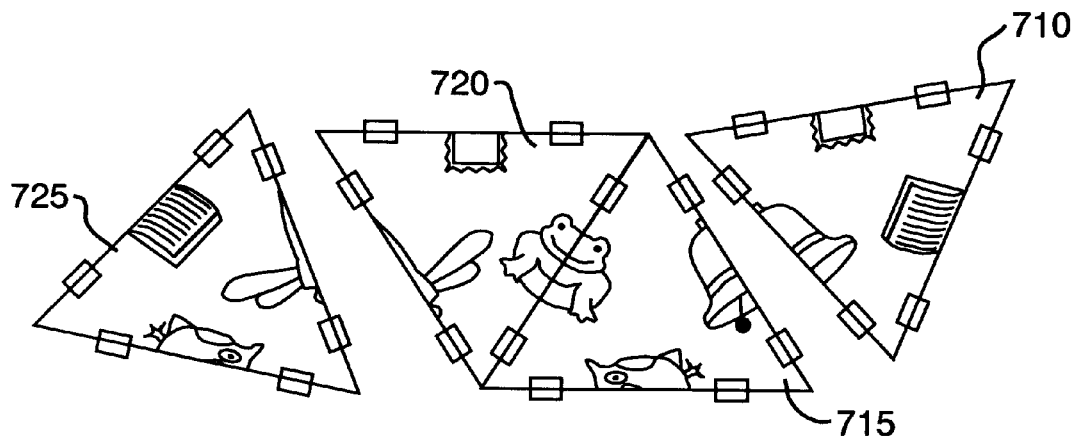
FIG. 7 is a plan view of planar, triangular elements having partial pictorial elements that are completed by edge-to-edge placement.

For example, the triangular elements shown in FIG. 7 are configured for a storytelling application. Element 710 contains on its three edges incomplete pictorial representations of a picture frame, a book, and a bell; element 715 has the remainder of the bell, part of a frog and part of an owl; element 720 contains the rest of the picture frame of element 710, the rest of the frog of element 715, and part of a dragonfly; and element 725 contains the rest of the dragonfly, the owl and the book. Because each edge of each element is uniquely identified, its combination with any of the various edges of other elements is both unique and recognizable, both to the element itself and to a master element or computer, thereby conferring symbolic significance to particular combinations. Thus, for example, at the element level, combination of elements 715 and 720 (as shown) completes the frog picture. One or both of elements 715, 720 may programmed to recognize this particular combination (through the exchange of identifiers described above) and to respond thereto in a characteristic way (e.g., by causing I/O device 127 to emit a frog's call).

More globally, however, a host computer connected to one of the elements (or to a master element) can be programmed to respond not only to particular combinations, but to their temporal order as well. For example, if the user completes the frog picture followed by the bell symbol, the computer can be programmed to issue the frog's call (or to stream digital audio signals to one of the frog elements for local output over an on-board speaker); if the user disconnects the bell and completes the picture-frame symbol, the computer may display a photograph of the frog; and if the user then completes the book symbol, the computer may offer textual information.

In a storytelling mode, the user's completion of the frog picture may result in depiction of a frog on the computer's screen, while subsequent completion of the dragonfly picture can cause the displayed frog to eat a dragonfly. Thus, the story presented on screen is assembled from previously stored narrative elements, but the order of assembly and presentation is determined by the user's manipulation of the triangular elements. It should be stressed that the manner in which the on-screen representations are configured and stored is not critical; they can range from simple animations to elaborate Web pages written in HTML or Java that are selectively activated by the varying the elements' configurations. Temporal aspects of the story may be represented by configuring the computer to record the history of the user's interactions in a given session. For example, had the owl eaten the frog before the dragonfly appeared, the dragonfly might have survived.

While the one-way, height-based message-passing scheme described above thus has considerable flexibility, it is limited in the sense that elements cannot communicate among themselves; they can only announce their locations and interelement relationships to one another and to a master element. Moreover, individual elements cannot be addressed, and minute latencies associated with message-passing multiply as the message is passed through multiple elements.

To overcome these limitations, the processor-module terminals connected to contact S (see FIG. 1) define a serial communication bus extending over the entire network of elements. The interconnecting contacts S thereby behave as a multicast local area network, such that data placed on the bus by any processor module reaches the processor modules of all other elements. If system topology is irrelevant to a particular application, the serial communication line can replace the input and output ports $E_{C1}$, $E_{C2}$, but it is preferred to retain both systems to facilitate separate local and systemwide communication.

Such a configuration obviously requires a mechanism for arbitrating communications, since the line is open at all times to all processors. Suitable arbitration schemes (such as token rings, time-division multiplexing, etc.) are, of course, well characterized in the network art, and can be straightforwardly applied to the serial line of the present invention. In one such approach, the master element or host computer sends timing pulses over the serial line, facilitating time-division multiplexing of communications. For example, each uniquely identified processor module may also be associated with a unique timeslice (e.g., assigned by the host and perhaps reconsidered each time a new element is added) during which it is eligible to place data on the serial line. The messages may contain "header" portions specifying the identifier(s) of one or more intended recipient processors, with each processor configured to accept only those messages having its identifier (or a global identifier) in the header.

Different modes can be used to facilitate different forms of communication, including local, neighbor-to-neighbor communication. For example, in a local-communication mode—which is established, e.g., by the host's broadcast of a globally effective command-each element places a bit of data onto each $E_{C2}$ connector, and checks each $E_{C1}$ connector, at each timing pulse. More specifically, each element sends out a high or low signal to each edge; the same signal, representing the same bit, is sent to the different edges, and the signal continues for the duration of the timing pulse. The bits encode the element's identifier, as discussed above.

In a report mode, again initiated by a command message from the host, the elements send messages destined for the host. Each element is assigned a timeslice when it is eligible to place data onto the serial line. The data represent the same identification, height and neighbor information that would have passed element-to-element in the message-passing scheme discussed above.

In an interelement communication mode, elements are free to broadcast messages to other specified elements (or to all other elements generally) during assigned timeslices. Most straightforwardly, a transmitting element selects elements it wishes to receive a particular message by including their identifiers in the message header. Other designation schemes are also possible, however; for example, each element can be given multiple timeslices corresponding to designated recipients, so that transmission within a particular timeslices is sufficient to specify the destination. Messages can also travel from the host to specific elements. These messages may, for example, order particular elements to perform particular actions of which they are capable, generally via their I/O devices.

Numerous variations to the above designs are possible. For example, a system can have more than one host (or more than one master element), each host carrying a unique identifier and representing the system topology differently i.e., from its own perspective. The hosts may be simultaneously operative or alternate in their roles through an arbitration mechanism.

It will therefore be seen that the foregoing represents a highly flexible and versatile approach to the construction of modular computation systems, which can transcend the capabilities of the individual elements thereof in accordance with the user's design. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An electronic element configured for detachable connection to a plurality of other elements in an edge-to-edge relationship, the element comprising:

a. a polygonal body having a plurality of contact edges; and b. on each contact edge, at least one connector comprising at least one electrical contact and mating means for detachably joining the connector to a connector on another polygonal element having a complementary mating means and at least one electrical contact, alignment and joinder of the edges creating electrical connection between the electrical contacts, the joined edges being pivotable without disruption of the alignment and the electrical connection therebetween so as to facilitate non-planar connection to another polygonal element.

2. The element of claim 1 wherein each connector comprises a plurality of electrical contacts, the element further comprising processor means having power, ground, and serial terminals each coupled to an electrical contact of each connector.

3. The element of claim 1 wherein the mating means comprises at least one magnet disposed so as attract a magnet identically disposed within the complementary mating means so as to align the electrical contacts.

4. The element of claim 1 wherein the mating means comprises at least two magnets having alternating exterior poles and spaced along the connector so as to attract an identical number of magnets identically disposed within the complementary mating means so as to align the electrical contacts.

5. The element of claim 4 wherein the connector comprises a magnetically and electrically nonconductive tube having an interior and an exterior surface, the magnets being disposed within the tube and the at least one electrical contact being disposed on the exterior surface.

6. The element of claim 4 wherein the mating means comprises a series of magnets each being electrically conductive at least on its surface, the electrically conductive surfaces serving as electrical contacts.

7. The element of claim 6 wherein the magnets are unequally spaced along the connector.

8. The element of claim 5 wherein the electrical contacts are selected from the group consisting of metal traces, electrically conductive fabric, electrically conductive pile material, and conductive foam.

9. The element of claim 1 wherein the electrical contacts are electrically conductive fabric.

10. The element of claim 1 wherein the electrical contacts are electrically conductive pile material.

11. The element of claim 1 wherein the mating means comprises at least two segments of an electrically conductive hook-and-pile material, each segment being complementary to the other so as to mate with an identical number of complementary segments of the material identically disposed on the complementary mating means.

12. The element of claim 1 wherein the polygonal body is radially symmetric.

13. The element of claim 12 wherein the polygonal body has a triangular shape.

14. The element of claim 1 wherein the body is substantially planar, the connector permitting sufficient pivoting of the edges to facilitate construction of three-dimensional structures from a plurality of elements.

15. A user-definable data-transfer and processing structure constructed from separate processor elements joined together, the structure comprising an arrangement of user-connectable electronic elements each configured for detachable connection to a plurality of other such elements in an edge-to-edge relationship, each element comprising:

a. a polygonal body having a plurality of contact edges;

b. on each contact edge, at least one connector comprising at least one electrical contact and mating means for detachably joining the connector to another such connector on another of the electronic elements, alignment and joinder of the edges creating electrical connection between the contacts, the joined edges being pivotable without disruption of the alignment and the electrical connection therebetween; and c. processor means, coupled to an electrical contact of each connector, configured to perform any of a plurality of processing tasks and having an identifier associated therewith;

wherein d. connection of a first element to a neighboring element in edge-to-edge relationship causes the first-element processor means to exchange information with the second-element processor means over the electrical connection, the information comprising the identifier of each processor means, the exchanged information triggering an action.

16. The structure of claim 15 wherein the action is performed by each processor and comprises at least one of the processing tasks, the at least one task performed by the processor means of each element thereby depending on the information received from the processor means of each other element in contact therewith.

17. The structure of claim 16 wherein the processing tasks of at least some of the processing means include (a) generating a user-perceivable output, (b) accepting input, (c) sending information to a third element, and (d) taking no action.

18. The structure of claim 15 wherein one of the elements is a master element supplying power and control signals to each of the other elements.

19. The structure of claim 18 wherein each connector of each element comprises contacts, connected to the processor means, for transmitting power and data.

20. The structure of claim 18 wherein the data includes a route length between an element and the master element.

21. The structure of claim 20 wherein the route length for a reference element is a number of elements intervening between the reference element and the master element.

22. The structure of claim 20 wherein each connector of each element comprises (a) a receiving contact, coupled to the processor means, for receiving data from a neighboring element, and (b) a transmitting contact, coupled to the processor means, for transmitting the received data to a different neighboring element, the different neighboring element having a route length lower than any other different neighboring element, the data thereby propagating to the master element.

23. The structure of claim 18 wherein the action is performed by the master element.

24. The structure of claim 23 wherein the master element comprises means for generating a representation of the arrangement, the action being dictated by the arrangement.

25. The structure of claim 15 wherein each connector of each element comprises a data-transfer contact, coupled to the processor means, for exchanging data with any neighboring elements joined thereto and forming a common communication line connecting all of the elements of the arrangement, data placed on the communication line by one element reaching all of the other elements.

26. The structure of claim 15 wherein one of the elements is a master element supplying control signals over the communication line, the control signals arbitrating placement of data onto the communication line to avoid simultaneous placement by a plurality of elements.

27. The structure of claim 26 wherein the master element is configured to acquire the identifier of every other element in the arrangement, the control signals assigning, to each of the other elements in the arrangement, timeslices during which each said element is eligible to place data onto the communication line, the control signals further comprising timing pulses establishing the timeslices.

28. The structure of claim 26 wherein at least some of the elements are configured to accept from the communication line only data preceded by a code corresponding to the identifier associated with the element.

29. A user-definable data-transfer and processing structure constructed from separate processor elements joined together, the structure comprising an arrangement of user-connectable electronic elements each configured for detachable connection to a plurality of other such elements in an edge-to-edge relationship, each element comprising:

a. a polygonal body having a plurality of contact edges;

b. on each contact edge, at least one connector comprising at least one electrical contact and mating means for detachably joining the connector to another such connector on another of the electronic elements, joinder of the edges creating alignment and electrical connection between the contacts, the joined edges being pivotable without disruption of the alignment and the electrical connection therebetween; and c. processor means, coupled to an electrical contact of each connector, configured to perform any of a plurality of processing tasks and having an identifier associated therewith, each connector of each element comprising a data-transfer contact, coupled to the processor means, for exchanging data with any neighboring elements joined thereto and forming a common communication line connecting all of the elements of the arrangement, data placed on the communication line by one element reaching all of the other elements, the structure performing a set of processing tasks dependent on the selected arrangement.

\* \* \* \* \*